United States Patent [19]
Ryat

[11] Patent Number: 5,498,953
[45] Date of Patent: Mar. 12, 1996

[54] HCM BASED TRANSCONDUCTOR CIRCUITS

[75] Inventor: Marc H. Ryat, Santa Clara, Calif.

[73] Assignee: SGS-THOMSON Microelectronics, Inc., Carrollton, Tex.

[21] Appl. No.: 160,579

[22] Filed: Nov. 30, 1993

Related U.S. Application Data

[63] Continuation-in-part of Ser. No. 70,274, Jun. 1, 1993, which is a continuation-in-part of Ser. No. 31,647, Mar. 15, 1993, which is a continuation-in-part of Ser. No. 950,091, Sep. 23, 1992.

[51] Int. Cl.⁶ .................................................. G05F 3/26
[52] U.S. Cl. ........................... 323/315; 323/312; 363/73
[58] Field of Search ................................. 323/312, 313, 323/315, 316, 317, 281; 307/490, 491; 363/73; 330/250; 327/530, 538

[56] References Cited

U.S. PATENT DOCUMENTS

| | | | |
|---|---|---|---|
| 4,004,247 | 1/1977 | Van de Plassache | 330/30 D |
| 4,937,516 | 6/1990 | Sempel | 323/315 |
| 4,952,866 | 8/1990 | Van Tuijl | 323/315 |
| 4,970,452 | 11/1990 | Barbu et al. | 323/317 |
| 4,999,760 | 3/1991 | Tietema | 363/53 |

*Primary Examiner*—Peter S. Wong
*Assistant Examiner*—Adolf Berhane
*Attorney, Agent, or Firm*—Richard A. Bachand; Lisa K. Jorgenson; Richard K. Robinson

[57] ABSTRACT

A transconductor circuit has first and second half cascode mirror circuits. Each half cascode mirror circuit has a cascode transistor, an active transistor, a base current compensating transistor, and a current source connected at one side to a supply voltage and at another side to the cascode transistor. The cascode and active transistors are connected in series between the current source and a first reference potential node. The base current compensating transistor is connected between the supply voltage and the base of the active transistor, and has its base connected between the current source and the cascode transistor. The bases of the cascode transistors of the first and second half cascode mirror circuits are connected to a second reference potential. First and second output mirror circuits are connected to mirror a current in a respective active transistor of the first and second half cascode mirror circuits. When a balanced input voltage is applied to respective voltage input nodes between the cascode and active transistors, corresponding balanced output currents are produced by the first and second output mirror circuits. In floating implementation, a biasing current source is connected between the first reference potential node and ground, and a biasing circuit connected to reference the second reference potential to a potential on the first reference potential node. Since the circuit may be made entirely of NPN transistors, it can run much faster than if PNP transistors were employed. Since the circuit is operated as a "quasi open-loop" circuit, the speed of operation is also enhanced. The circuit can be operated in class AB operation, if desired, or, if desired, in a class B—like mode of operation. Additionally, the output current is independent of the β of the transistors, and the circuit can sink current to the physical limits of the active transistor components, thus enabling a high dynamic range of operation.

36 Claims, 6 Drawing Sheets

HCM BASED TRANSCONDUCTOR CIRCUITS

CROSS-REFERENCE TO RELATED APPLICATIONS

This application is a continuation-in-part of U.S. patent application Ser. No. 08/070,274, filed Jun. 1, 1993, (Attorney Docket No. 93-S-46CIP2) entitled "Wideband Linear and Logarithmic Signal Conversion Circuits", said application being a continuation-in-part of U.S. patent application Ser. No. 08/031,647, filed Mar. 15, 1993, entitled "Linear Transconductors", said application being a continuation-in-part of U.S. patent application Ser. No. 07/950,091, filed Sep. 23, 1992, entitled "A Precise Current Generator", by applicant herein, which claims priority from French application 91/12278, filed Sep. 30, 1991, by applicant herein, all of which are incorporated herein by reference.

BACKGROUND OF THE INVENTION

1. Field of the Invention

This invention relates to improvements in electronic circuits, and more particularly to improvements in voltage to current signal conversion circuits, and to circuits in which the improved signal conversion circuits may be embodied.

2. Relevant Background

In the past, circuits used for signal conversion, more particularly voltage-to-current or current-to-voltage conversion, suffered numerous deficiencies. Often, for example, the linearity of the circuits was affected by parasitic emitter or base resistors of the transistors used in their design. Additionally, since typically the input to most widely used circuits is applied to the base element of an input transistor, a high swing capability could not be achieved.

Most of the circuits previously employed used operational amplifiers or buffers in closed loop structures, as well as PNP-type transistors, and, consequently, the speed of the circuit was less than that which might otherwise have been achieved. In order to make closed loop systems stable, compensation capacitors were typically employed. Such compensation capacitors, however, resulted in lower speed and overall larger sized circuits. The necessary PNP transistors of many of circuits made their stability even more difficult to ensure.

Furthermore, many of the circuits previously employed produced an output that was dependent upon the beta of the transistors of the circuit. This resulted in a loss of temperature stability of their transfer function.

SUMMARY

In light of the above, it is, therefore, an object of the invention to provide an improved signal conversion circuit that can be used for voltage-to-current conversion.

It is another object of the invention to provide an improved signal conversion circuit of the type described that can produce highly linear signal conversion, can be used in a differential mode, and can additionally be used in beta independent class AB operation.

It is another object of the invention to provide an improved signal conversion circuit of the type described in which the linearity of the circuit is not affected by the parasitic emitter or base resistors of the transistors of the circuit.

It is yet another object of the invention to provide a signal conversion circuit of the type described that can achieve a high input voltage swing capability.

It is still another object of the invention to provide a signal conversion circuit of the type described that can achieve fast operation with quasi-open-loop structures.

It is still another object of the invention to provide a signal conversion circuit of the type described that requires no compensation capacitors, enabling simple and compact structures to be achieved in integrated circuits or the like.

It is still another object of the invention to provide a signal conversion circuit of the type described that can operate with low supply voltages and can accurately convert low input signal levels with high gain.

It is yet another object of the invention to provide a signal conversion circuit of the type described that can operate over a wide frequency band, without the use of PNP components.

These and other objects, features and advantages of the invention will be apparent to those skilled in the art from the following detailed description of the invention, when read in conjunction with the accompanying drawings and appended claims.

In accordance with a broad aspect of the invention, a transconductor circuit is presented. The circuit has first and second half cascode mirror circuits, the first half having first, second, and third transistors. A first reference current source having a connection at one side to a supply voltage is connected at another side to the first transistor. The first and second transistors are connected in series between the first reference current source and a first reference voltage, the first transistor having a current control element connected to a second reference voltage. The third transistor is connected between the supply voltage and a current control element of the second transistor, and has a current control element connected between the first reference current source and the first transistor. A first input signal receiving node is provided between the first and second transistors, and a first output circuit is arranged to provide an output signal proportional to a current flowing in the second transistor. The second cascode mirror circuit half also fourth, fifth, and sixth transistors that correspond the first, second and third transistors of the first cascode mirror circuit half. A second reference current source having a connection at one side to a supply voltage is connected at another side to the first transistor. The fourth and fifth transistors are connected in series between the second reference current source and the first reference voltage, the fourth transistor having a current control element connected to the second reference voltage. The sixth transistor is connected between the supply voltage and a current control element of the fifth transistor, and has a current control element connected between the second reference current source and the fourth transistor. A second input signal receiving node is provided between the fourth and fifth transistors, and a second output circuit is arranged to provide an output signal proportional to a current flowing in the fifth transistor.

The transconductor circuit may include first and second input resistors, which may be of equal value, connected between respective voltage input terminals and the respective collectors of the second and fifth transistors, whereby a differential voltage input may be applied to the circuit. The first, second, third, fourth, fifth, and sixth transistors are bipolar transistors, and, more particularly, may be NPN transistors, whereby PNP transistors are not needed to realize the circuit. In one embodiment, the transistors are MOS transistors.

In accordance with another broad aspect of the invention, a transconductor circuit is presented that has first and second half cascode mirror circuits. Each half cascode mirror circuit has a cascode transistor, an active transistor, a base current compensating transistor, and a current source connected at one side to a supply voltage and at another side to the cascode transistor. The cascode and active transistors are connected in series between the current source and a first reference potential node. The base current compensating transistor is connected between the supply voltage and the base of the active transistor, and has its base connected between the current source and the cascode transistor. The bases of the cascode transistors of the first and second half cascode mirror circuits are connected to a second reference potential. First and second output mirror circuits are connected to mirror a current in a respectively one of the active transistors of the first and second half cascode mirror circuits, whereby, when a balanced input voltage is applied to respective voltage input nodes between the cascode and active transistors, for example by resistors that may be of equal value, corresponding balanced output currents are produced by the first and second output mirror circuits. The transconductor circuit can be implemented entirely of NPN transistors, and may, if desired, be floating or fixed. If a floating implementation is used, a biasing current source is connected between the first reference potential node and ground, and a biasing circuit connected to reference the second reference potential to a potential on the first reference potential node.

In accordance with another broad aspect of the invention, a transconductor circuit is presented that has first and second half cascode mirror circuits. Each of the half cascode mirror circuits has a cascode transistor, an active transistor, a base current compensating transistor, and a current source connected at one side to a supply voltage and at another side to the cascode transistor. The cascode and active transistors are connected in series between the current source and a first reference potential node. The base current compensating transistor is connected between the supply voltage and the base of the active transistor, and has its base connected between the current source and the cascode transistor. The bases of the cascode transistors of the first and second half cascode mirror circuits are connected to receive balanced voltage inputs. A resistor is connected between a junction in each the first and second half cascode mirror circuits between the active and cascode transistors, and first and second output circuits are connected to mirror a current in the first and second half cascode mirror circuits. Each output circuit has an output current transistor and a level shifting transistor connected in series between an output terminal and the first reference potential node, a base of the output current transistor being connected to the base of the cascode transistor. First and second floating level shifting current sources are connected between the respective first reference potential nodes of the first and second half cascode mirror circuits and a ground potential, whereby, when a balanced voltage inputs are applied, corresponding balanced output currents are produced by the first and second output circuits. The circuit can be implemented with all of the transistors being NPN bipolar transistors.

In accordance with yet another broad aspect of the invention, a transconductor circuit is presented that has first and second half cascode mirror circuits. Each of the half cascode mirror circuits has a cascode transistor, an active transistor, a base current compensating transistor, and a current source connected at one side to a supply voltage and at another side to the cascode transistor. The cascode and active transistors are connected in series between the current source and a first reference potential node, the base current compensating transistor is connected in series with a base bias resistor between the supply voltage and the base of the active transistor, with its base connected between the current source and the cascode transistor. The bases of the cascode transistors of the first and second half cascode mirror circuits are connected to receive balanced voltage inputs, and a resistor is connected between a junction in each the first and second half cascode mirror circuits between the active and cascode transistors. First and second output circuits are connected to mirror a current in the first and second half cascode mirror circuits, each output circuit comprising an output current transistor connected in parallel with a respective active transistor of the first and second half cascode mirror circuits. First and second floating level shifting current sources are connected between the respective first reference potential nodes and a ground potential. In addition, each of the first and second half cascode mirror circuits may include a feedforward capacitor connected between the base of the base current compensating transistor and the base of the active transistor. The feed forward capacitors and the base bias resistors of the first and second half cascode mirror circuits may be of equal value. Again, all of the transistors may be NPN bipolar transistors.

According to another broad aspect of the invention, another embodiment of the transconductor circuit is presented. The transconductor circuit has first and second half cascode mirror circuits. Each of the half cascode mirror circuits has a cascode transistor, an active transistor, a base current compensating transistor, and a current source connected at one side to a supply voltage and at another side to the cascode transistor. The cascode and active transistors are connected in series between the current source and a first reference potential node. The base current compensating transistor is connected in series with a base bias resistor between the supply voltage and the base of the active transistor, and has its base connected between the current source and the cascode transistor. The bases of the cascode transistors of the first and second half cascode mirror circuits are connected to receive balanced voltage inputs, and a resistor is connected between a junction in each the first and second half cascode mirror circuits between the active and cascode transistors. First and second output circuits are connected to mirror a current in the first and second half cascode mirror circuits. Each output circuit has an output current transistor, the base of the output current transistor being connected to the base of a respective active transistor of the first and second half cascode mirror circuits. An output current source is connected between the supply voltage source and the output current transistors of the first and second half cascode mirror circuits. The transconductor circuit may also include feedforward capacitors connected between the base of the base current compensating transistor and the base of the active transistor in each half cascode mirror circuit. In this circuit embodiment, the transistors of the first and second half cascode mirror circuits are NPN transistors, and the output current transistors are PNP transistors.

In accordance with yet another broad aspect of the invention, a nonlinearity compensated transconductor circuit is provided that has first and second half cascode mirror circuits. The first half cascode mirror circuit has first, second, and third transistors, and a first reference current source having a connection at one side to a supply voltage and at another side to the first transistor. The first and second transistors are connected in series between the first reference current source and a first reference voltage, the first transistor having a current control element connected to a second reference voltage. The third transistor is connected between the supply voltage and a current control element of the second transistor, and has a current control element connected between the first reference current source and the first transistor. A first output circuit is arranged to provide an output signal proportional to a current flowing in the second transistor.

The second half cascode mirror circuit has fourth, fifth, and sixth transistors, and a second reference current source having a connection at one side to a supply voltage and at another side to the fourth transistor. The fourth and fifth transistors are connected in series between the second reference current source and the first reference voltage, the fourth transistor having a current control element connected to the second reference voltage. The sixth transistor is connected between the supply voltage and a current control element of the fifth transistor, and has a current control element connected between the second reference current source and the fourth transistor. A second output circuit is arranged to provide an output signal proportional to a current flowing in the fifth transistor.

A first nonlinearity correction circuit is associated with the first cascode mirror circuit, and has a seventh and an eighth transistor and a third reference current source, connected in series between the supply voltage and a junction between the fourth and fifth transistors of said second cascode mirror circuit, a control element of said seventh transistor being connected to receive a first input voltage signal, and a control element of said eighth transistor being connected to said second reference voltage. A second nonlinearity correction circuit is associated with said first cascode mirror circuit, and has a ninth and a tenth transistor and a fourth reference current source, connected in series between the supply voltage and a junction between the first and second transistors of said first cascode mirror circuit, a control element of said ninth transistor being connected to receive a second input voltage signal, and a control element of said tenth transistor being connected to said second reference voltage. A first resistor is connected between junctions of said first and second and said fourth and fifth transistors of said first and second cascode mirror circuits, and a second resistor is connected between junctions of said seventh transistor with said third reference current source and said ninth transistor with said fourth reference current source. In a preferred embodiment, the first, second, third, fourth, fifth, and sixth transistors are NPN bipolar transistors, and the seventh, eighth, ninth, and tenth transistors are MOS FET transistors. Additionally, in a preferred embodiment, the first and second resistors are equal.

In accordance with still another broad aspect of the invention, a Class AB transconductor circuit is provided. The circuit has first, second, third and fourth half cascode mirror circuits. Each of the transconductor circuits has a cascode transistor, an active transistor, and a base current compensating transistor, and a current source connected at one side to a supply voltage and at another side to the cascode transistor. The cascode and active transistors are connected in series between the current source and a first reference potential node. The base current compensating transistor is connected between the supply voltage and the base of the active transistor, and has its base connected between the current source and the cascode transistor. The bases of the cascode transistors of the first and third half cascode mirror circuits are connected to a second reference potential. The bases of the cascode transistors of the second and fourth half cascode mirror circuits are connected to receive an input voltage. A first resistor is connected between junctions between the active and cascode transistors of the first and second half cascode mirror circuits, and a second resistor is connected between junctions between the active and cascode transistors of the third and fourth half cascode mirror circuits. An output circuit comprising two output transistors connected in series between first and second current output terminals is provided with a base element of each transistor connected to be controlled by a potential on respective ones of the first and second resistors. The cascode, active, and base current compensating transistors of the first and second half cascode mirror circuits are NPN transistors, and the cascode, active, and base current compensating transistors of the third and fourth half cascode mirror circuits are PNP transistors. In a preferred embodiment, an input resistor is connected to apply an input voltage on an input terminal to the bases of the cascode transistors of the second and fourth half cascode mirror circuits, the input resistor having a value of one half of the resistance of each of the first and second resistors.

BRIEF DESCRIPTION OF THE DRAWINGS

The invention is illustrated in the accompanying drawings, in which.

DETAILED DESCRIPTION OF THE PREFERRED EMBODIMENT

In the copending patent application, Ser. No. 08/070,274, filed Jun. 1, 1993, (Attorney Docket No. 93-S-46CIP2), a "half-cascode mirror" (HCM) circuit is described that used three NPN transistors. A pair of the transistors are connected in series with a first reference current source between a supply voltage and a first reference voltage, or ground. The base of the top transistor of the series pair is connected to a second reference voltage, VB. A third transistor is connected between the supply voltage and the base of the bottom transistor or the series pair, with its base connected between the first reference current source and the top transistor. An input signal receiving node is provided between the top and bottom transistors of the pair. With the HCM thus constituted, an output circuit may be arranged to provide an output signal proportional to a current flowing in the bottom transistor of the pair of the HCM circuit.

Figure 1:
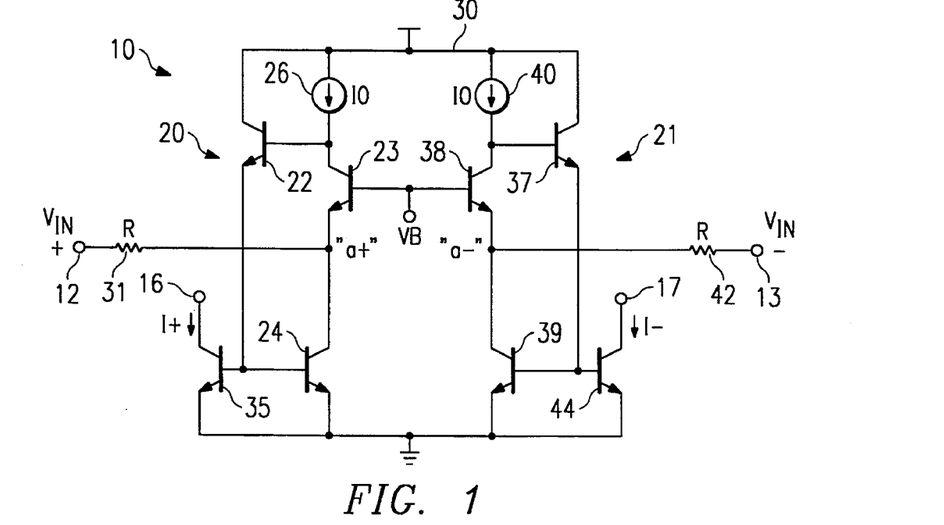
FIG. 1 is an electrical schematic diagram of a transconductor circuit, in accordance with the invention.

As shown in FIG. 1, the invention provides a transconductor circuit 10 that is based on two HCM circuits of the type described in the application Ser. No. 08/070,274. The circuit 10 has differential voltage input terminals 12 and 13, and differential current output terminals 16 and 17. The circuit 10 has similarly constructed two HCMs 20 and 21. The HCM 20 has three bipolar NPN transistors, 20, 23, and 24. Transistor 23 is referred to herein as a "cascode" transistor, and transistor 24 is referred to as an "active" transistor. Transistor 22, is referred to as a "base current compensating" transistor. A reference current source 26 that supplies a current I0 is connected between a $V_{cc}$ rail 30 and the collector of the cascode transistor 23. Although the reference current I0 is shown of fixed value, it can be varied, if needed.

The base of the cascode transistor 23 is connected to a bias reference voltage, VB, which, as will become apparent, can be, for example, $2V_{BE}$ above ground. The emitter of the cascode transistor 23 is connected to the collector of the active transistor 24. The base current compensating transistor 23 has its collector connected to the $V_{cc}$ rail 30 and its emitter connected to the base of the active transistor 24. The base current compensating transistor 22 serves to provide a voltage level shift between the base of the active device 24 and the collector of the cascode device 23. In essence, the base current compensating device 22 isolates the base of the active device 24 with respect to the collector of the cascode transistor 23. The base of the current compensating transistor 22 is connected to the collector of the cascode transistor 23. A first voltage input on terminal 12 is connected through a series resistor 31 of value R1 to node "a+" at the emitter of the cascode transistor 23. 25 A current output I+ from the first HCM circuit 20 is developed by a mirror transistor 35. Since the base and emitter of transistors 24 and 35 are interconnected, the current that flows through the mirror transistor 35 will necessarily copy or mirror the current flowing through the active transistor 24, thereby providing a first current output from the circuit.

The other HCM 21 also has three bipolar NPN transistors, 37, 38, and 39. Transistor 37 is the "cascode" transistor, transistor 39 is the "active" transistor, and transistor 37, is the "base current compensating" transistor. A reference current source 40 supplies a reference current I0 between the $V_{cc}$ rail 30 and the collector of the cascode transistor 38. Like the current source 26, the reference current I0 can be varied, if needed.

The base of the cascode transistor 38 is also connected to the bias reference voltage, VB. The emitter of the cascode transistor 38 is connected to the collector of the active transistor 24. The base current compensating transistor 37 has its collector connected to the $V_{cc}$ rail 30 and its emitter connected to the base of the active transistor 39. The base of the current compensating transistor 37 is connected to the collector of the cascode transistor 38. A second voltage input on terminal 13 is connected though a series resistor 42 of value R1 to node "a–" at the emitter of the cascode transistor 38. A current output I– from the second HCM circuit 21 is developed by a mirror transistor 44.

With the transconductor circuit 10 thus constructed, nodes "a+" and "a–" will be at a fixed voltage, VB - $V_{be(23)}$, and VB - $V_{be(38)}$, respectively, independently of the devices connected to node "a+" and "a–", such as, for example, resistors 31 and 42. This is true for any values of output currents. Thus, when a voltage is applied to the input terminal 12, the current that flows through the resistor 31 is equal to the difference between the voltage applied to the terminal 12 minus the voltage on node "a+" divided by the value of the resistor 31. This current adds to the current I0 and flows through the active transistor 24 to ground. This current also is mirrored in the output current I+ through transistor 35. The same is true for the transconductor circuit of the HCM 21, to produce the output current I– from an input voltage applied to the terminal 13.

In the circuit embodiment of FIG. 1, the two HCMs 20 and 21 have a common base bias VB.

$$I+ = I_{24} = I0 + \frac{v+ - (VB - V_{be23})}{R}$$

$$I- = I_{39} = I0 + \frac{v- - (VB - V_{be38})}{R}$$

$V_{be23} = V_{be38}$ since the same current I0 flows through transistors 23 and 38. Therefore, $$I_{OUT} = I+ - I- = \frac{V+ - V-}{R} = \frac{V_{IN}}{R}$$

$$I+ + I- = 2I0 + \frac{V+ + V- - 2VB + V_{be23} + V_{be38}}{R}$$

The output current is directly proportional to the input voltage, without any base current effect on accuracy the V-to-I transfer function is for this reason very stable in temperature.

One advantage of the circuit 10 is that since it is fabricated entirely of NPN transistors, it can run much faster than if PNP transistors were employed. Moreover, since the circuit is operated as a "quasi open-loop" circuit, the speed of operation is enhanced. Because of the very high speed of the circuit, the circuit is well suited to high frequency applications. Also, the circuit 10 can be operated in class AB operation, if desired, or, if desired, in a class B mode of operation. Another significant advantage is that the output current of the circuit 10 is independent of the β of the transistors.

Still another of the advantages of the circuit 10 is its ability to sink current to the physical limits of the active transistor components. This enables a high dynamic range of operation. For example, if a low voltage is applied to the + input terminal 12, a current will flow through the resistor 31, through the transistor 23 from the plus rail 30, to the extent of the value of the current I0 supplied by the current source 26. On the other hand, when the voltage on the input terminal 12 goes high, the current in the resistor 31 will flow through the active transistor 24. If the current exceeds the current I0, it will merely add to it, and is not limited by it. A similar condition exists on the other half HCM circuit 21, thus resulting in a high dynamic range of operation being enabled.

Figure 2:
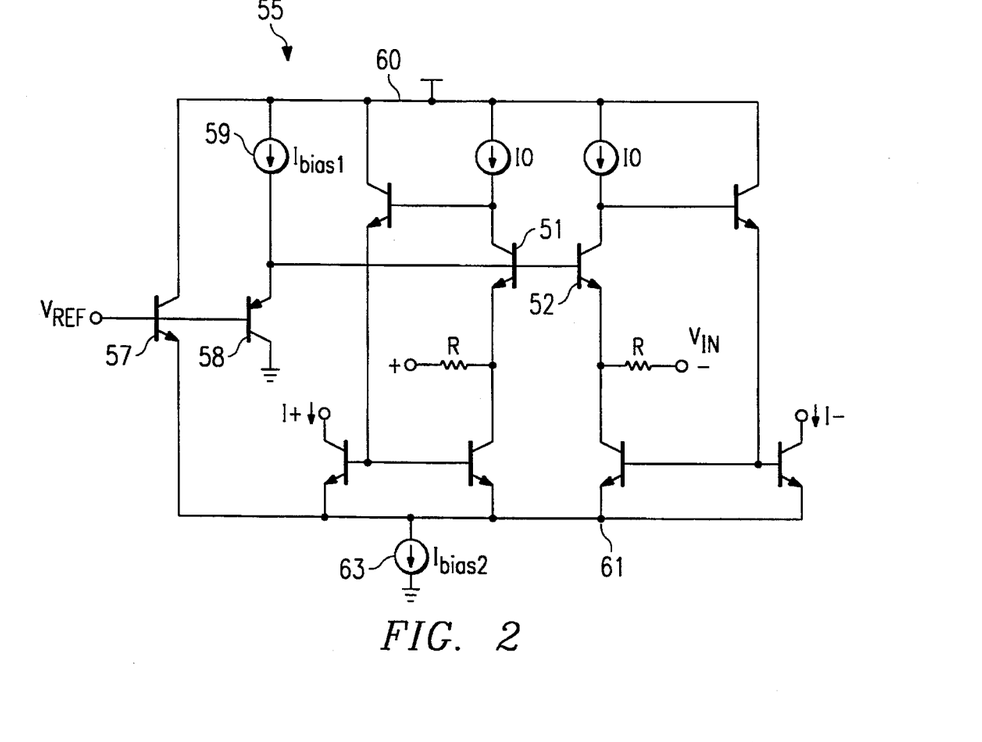
FIG. 2 is an electrical schematic diagram of a floating version of the transconductor circuit of FIG. 1, in accordance with the invention.

A floating version 55 of the circuit of FIG. 1 is shown in FIG. 2. The circuit 55 of FIG. 2 is constructed similarly to the circuit of FIG. 1, except the reference voltage that is applied to the bases of the cascode transistors 51 and 52 is generated by a circuit 55 that is referenced to a reference rail $V_{REF}$. The reference voltage generating circuit 55 has a PNP transistors 58 connected in series with a current source 59, between the $V_{cc}$ rail 60 and ground. A NPN transistor 57 is connected between the $V_{cc}$ rail 60 and the reference rail 61 to which the remainder of the circuit 55 is also referenced. A reference voltage $V_{REF}$ is applied to the bases of the transistors 57 and 58. A current source 63 is connected between the reference rail 61 and ground, whereby the entire circuit can float in a manner determined by the value of the current sourced by the current source 63.

Figure 3:
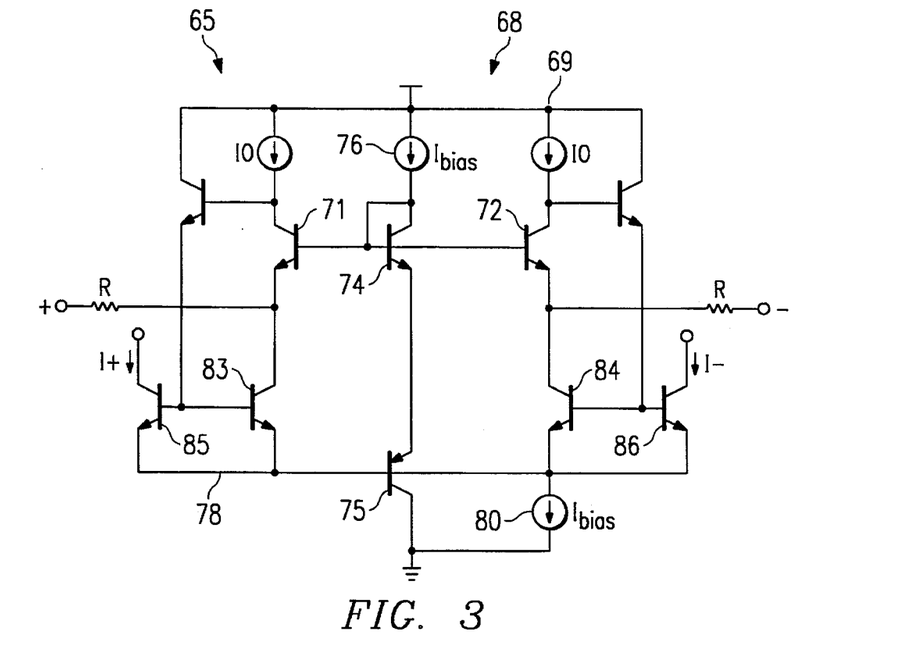
FIG. 3 is an electrical schematic diagram of another floating version of the transconductor circuit of FIG. 1, in accordance with the invention.

Another floating version of the circuit 65 of FIG. 1 is shown in FIG. 3. In the circuit 65, a reference voltage generating circuit 68 is provided between the $V_{cc}$ rail 69 and ground. In the dual HCM circuit 65 the bases of the cascode transistors 71 and 72 are connected together, and to the base of an NPN transistor 74. The circuit 68 has transistor 74 connected in series with a PNP transistor 75 and a current source 76 between the Vcc rail 69 and ground. The base of the transistor 75 is connected to the reference rail 78. Another current source 80 that may provide a current, for example, of 4I0, is connected between the reference rail 78 and ground.

In the circuit 65, the current source 80 biases the emitters of the active transistors 83 and 84. The emitter voltages, $V_e$, of the transistors 71 and 72 are equal.

$$I_{83} = I0 + \frac{V+ - V_e}{R}$$

and $$I_{84} = I0 + \frac{V- - V_e}{R}$$

$$I_{85} = I_{83} \text{ and } I_{86} = I_{84}$$

$$I_{83} + I_{84} + I_{85} + I_{86} = 4I0$$

Thus, $$4I0 = 2I0 + \frac{2(V+ - V_e)}{R} + 2I0 + \frac{2(V- - V_e)}{R}$$

and $V+ + V- - 2V_e = 0$.

This leads to:

$$V_e = \frac{V+ + V-}{2}$$

which, in turn, leads to:

$$I+ = I0 + \frac{V+ - V-}{2R}$$

and $$I- = I0 + \frac{V- - V+}{2R}$$

and $$I_{OUT} = I+ - I- = \frac{V+ - V-}{R}$$

and $I+ + I- = 2I0$.

Figure 4:
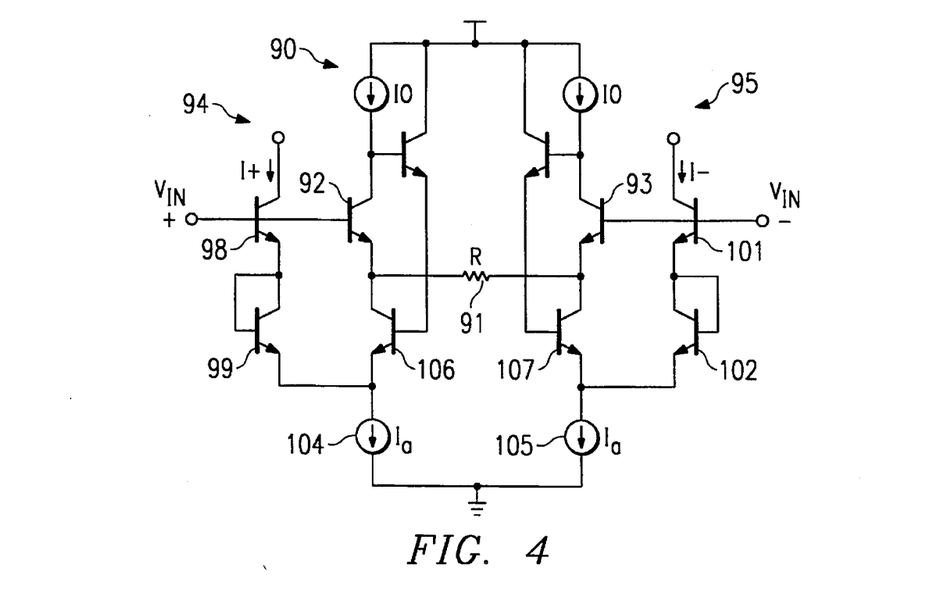
FIG. 4 is an electrical schematic diagram of yet another floating version of the transconductor circuit of FIG. 1, in accordance with the invention.
Figure 5:
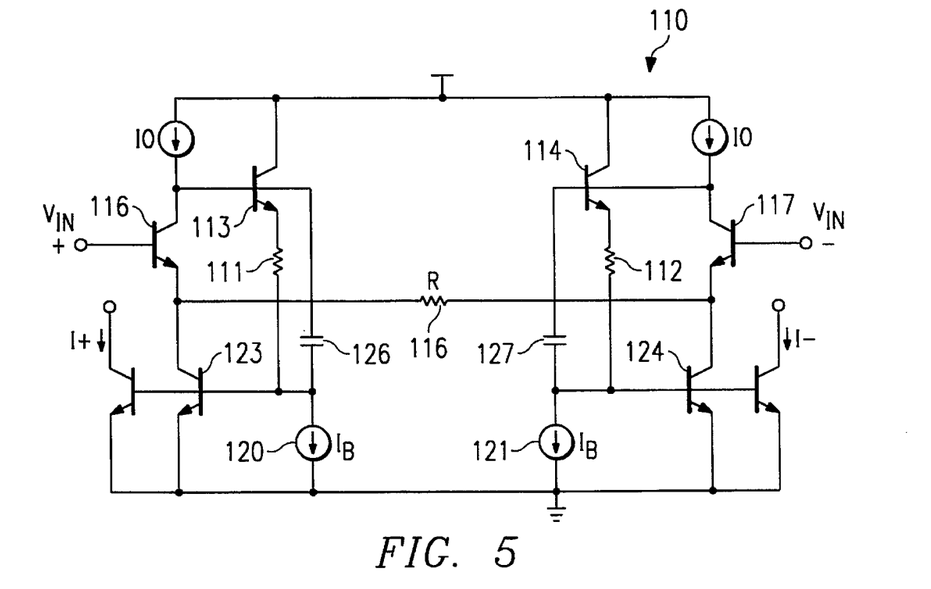
FIG. 5 is an electrical schematic diagram of yet another version of the transconductor circuit of FIG. 1, referenced to ground, in accordance with the invention.

FIG. 4 shows another floating version 90 of the dual HCM circuit of FIG. 1. In FIG. 5, a resistor 91 is connected between the emitters of the cascode transistors 92 and 93. The output current is mirrored by the circuits 94 and 95. The circuits 94 and 95 have respectively NPN transistors 98 and 99, and transistors 101 and 102 connected in series, with the bases of transistors 98 and 101 being connected respectively to cascode transistors 92 and 93. Additional current sources 104 and 105 are connected from the emitters of the active transistors 106 and 107 to ground.

In the circuit 90, $$I_{106} = -\frac{V_{IN}}{R} + I_0$$

$$I_{107} = +\frac{V_{IN}}{R} + I_0$$

$$I+ = i_a - (I_{106} + I_{b106}) - I_{b98} = I_a - I0 + \frac{V_{IN}}{R} - I_{b106} - I_{b98}$$

and $$I- = i_a - (I_{107} + I_{b107}) - I_{b101} = I_a - I0 - \frac{V_{IN}}{R} - I_{b107} - I_{b101}$$

Thus, $$I+ - I- = \frac{2V_{IN}}{R} + (I_{b107} - I_{b106}) + (I_{b101} - I_{b98})$$

since $$(I_{b107} - I_{b106}) + (I_{b101} - I_{b98}) \sim 0 \text{ if } I_a = 2I0:$$

$$I_{OUT} = \frac{2V_{IN}}{R}$$

$$I+ + I- = 2(I_a - I0) - I_{b106} - I_{b98} - I_{b107} - I_{b101}$$

Another version 110 of the circuit 10 of FIG. 1 is shown in FIG. 5. In the circuit 110, resistors 111 and 112 are placed in series with the base current compensating transistors 113, and 114. A resistor 116 is connected between the emitters of the cascode transistors 116 and 117. Finally, current sources 120 and 121 are connected from the bases of the active transistors 123 and 124 to ground capacitors 126 and 127 are connected between the bases of base current compensating transistors 113 and 114 and the respective current sources 120 and 121.

In the circuit embodiment 110, the resisters 111 and 112, with the current sources 120 and 121, provide level shifting on the bases of transistors 113 and 114 to allow V+ and V- to swing without saturating under the transistors 113 and 114. The capacitors 126 and 127 are feedforward capacitors that bypass the level shift resisters 111 and 112 at high frequencies. The resistors 111 and 112 may also be replaced by a DC voltage generator or other level shifting device.

In the circuit 110:

$$I+ = I0 - \frac{V_{IN}}{R}$$

and $$I- = I0 + \frac{V_{IN}}{R}$$

Hence:

$$I_{OUT} = \frac{2V_{IN}}{R}$$

Figure 6:
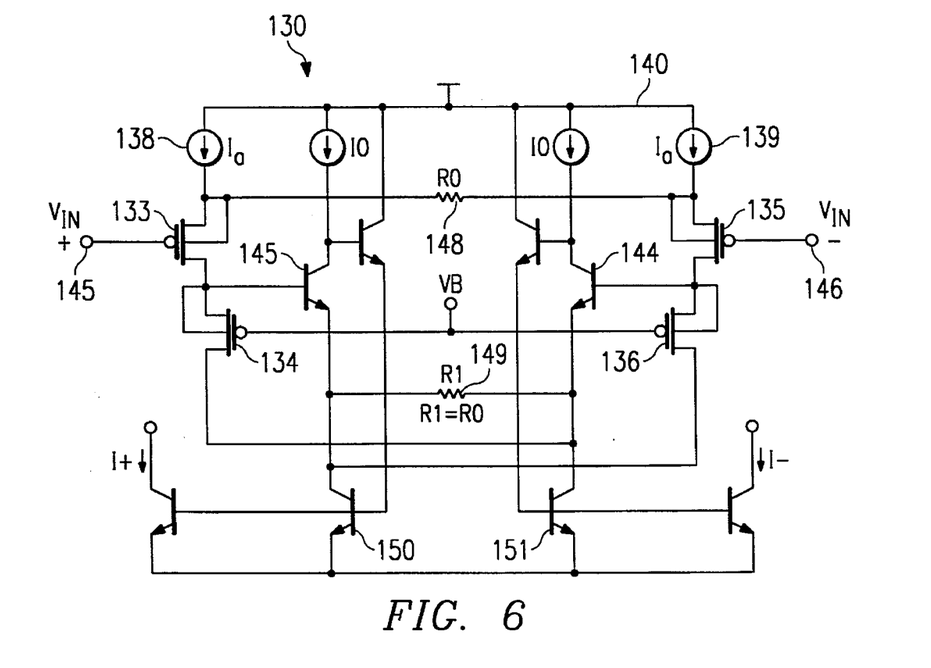
FIG. 6 is an electrical schematic diagram of a cross-coupled transconductor circuit incorporating the circuit of FIG. 1 to correct the circuit nonlinearities.

FIG. 6 shows a circuit embodiment 130 in which the circuit of FIG. 1 is incorporated to correct the nonlinearity of a transconductor circuit, using MOS type devices. The cross-coupled circuit 130 has four MOSFET transistors 133, 134, 135, and 136, with the transistors 133 and 134 connected in series with a current source 138 between the Vcc rail 140 and the emitter of the cascode transistor 144 on the HCM circuit on the opposite side. The + input received on terminal 145 is applied to the gate of the transistor 133. The base of the cascode transistor 145 is connected to the source of the transistor 134.

Similarly, the transistors 135 and 136 are connected in series with a current source 139 between the vcc rail 140 and the emitter of the cascode transistor 145 on the HCM circuit on the opposite side. The − input received on terminal 146 is applied to the gate of the transistor 135. The base of the cascode transistor 144 is connected to the source of the transistor 136.

A first resistor 148 is connected between the sources of the transistors 133 and 135, and a second resistor 149 is connected between the emitters of the cascode transistors 144 and 145. The first and second resistors 148 and 149 can be of equal value.

In the circuit 130 of FIG. 6,:

$$I_{133} = I_a + \frac{(V-- V_{GS135}) - (V+ - V_{GS133})}{R0} =$$

$$I_a + \frac{V_{GS133} - V_{GS135} - V_{IN}}{R0}$$

$$I_{135} = I_a + \frac{V_{GS135} - V_{GS133} + V_{IN}}{R0}$$

Nonlinearity comes from the term $$\frac{V_{GS133} - V_{GS135}}{R}.$$

$$I+ = I_{150} = I_{136} + \frac{V_{e144} - V_{e145}}{R1} + I0 =$$

$$I_{135} + \frac{V_{e144} - V_{e145}}{R1} + I0$$

$$I- = I_{133} + \frac{V_{e145} - V_{e144}}{R1} + I0.$$

$$V_{e144} = V_{s136} - V_{be144},$$

$$V_{e145} = V_{s134} - V_{be145}.$$

Thus, $V_{e144} - V_{e145} = V_{s135} - V_{s134}$, since $V_{be145} = V_{be144}$.

But, $V_{s136} - V_{s134} = V_{GS133} - V_{GS135}$

Thus, $$I+ = I_{135} + \frac{V_{GS133} - V_{GS135}}{R1} + I0 = I_a + I0 + \frac{V_{IN}}{R0}$$

and $$I- = I_a + I0 - \frac{V_{IN}}{R0}, \text{ hence,}$$

$$I_{OUT} = I+ - I- = \frac{2V_{IN}}{R0}.$$

Figure 7:
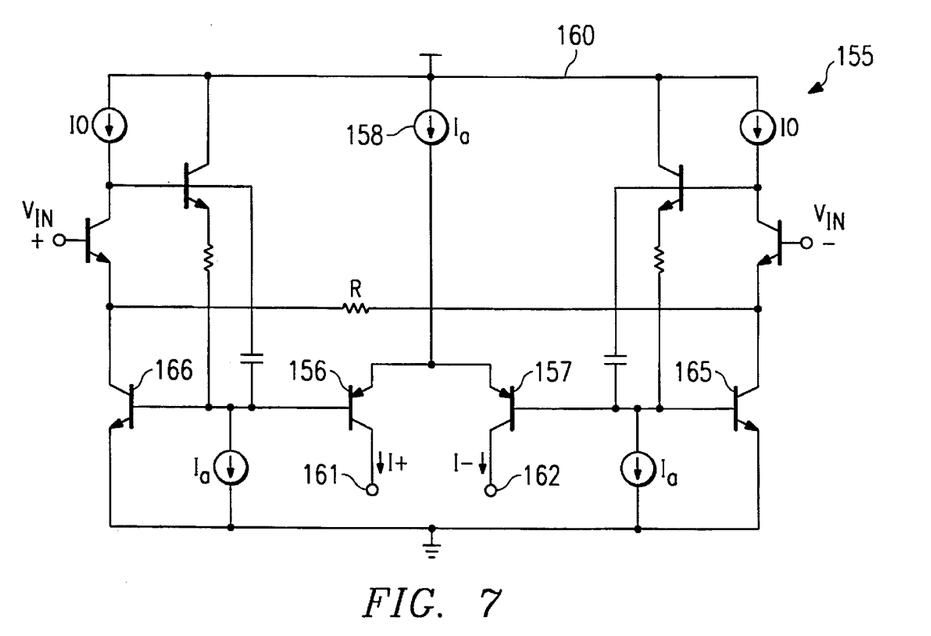
FIG. 7 is an electrical schematic diagram of another version of the transconductor circuit of FIG. 5, using PNP output mirror transistors, in accordance with the invention.

FIG. 7 is an electrical schematic diagram of another embodiment 155 of the transconductor circuit of FIG. 5, referenced to ground, using PNP output mirror transistors. Accordingly, first and second PNP transistors 156 and 157 are each connected in series with a current source 158, between the $V_{cc}$ rail 160 and the respective output terminals 161 and 162. The circuit embodiment provides a variable gain amplifier in which the gain can be varied by varying the value of current from the current source 158.

More particularly:

$$I_{165} - I_{166} = \frac{2V_{IN}}{R}$$

$$I_{165} + I_{166} = 2I0$$

$$I+ - I- = I_a \cdot \frac{I_{165} - I_{166}}{I_{166} + I_{165}} = I_a \cdot \frac{\frac{V_{IN}}{R}}{I0}$$

Consequently, the gain can be varied by varying $I_a$.

Figure 8:
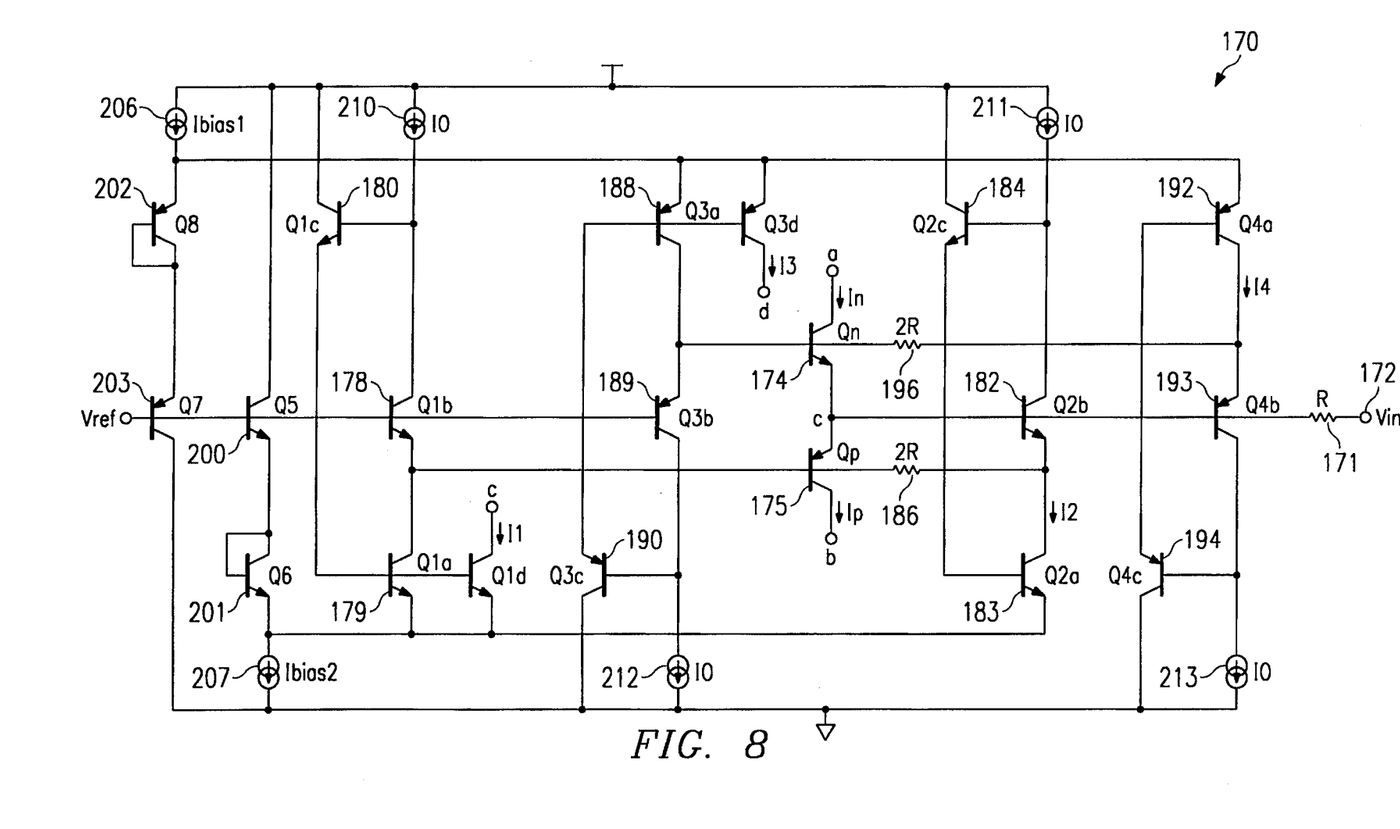
FIG. 8 is an electrical schematic diagram of a circuit, as an example of a Class AB amplifier, using the HCM circuit off FIG. 1.

FIG. 8 is an example of a Class AB transconductor 170, using the HCM circuits of the invention. The tranconductance is determined by the value, R, of the resistor 171 that is connected between the input terminal 172 and node "e", the common emitter node of transistors 174 and 175. The transistors 174 and 175 are NPN and PNP devices, respectively, and are the output devices of the transconductor. The differential output current Ip–In has its nonlinearity corrected by the remaining circuitry.

A first HCM, including transistors 178, 179, and 180 biases the base of the PNP transistor 175. A second HCM including transistors 182, 183 and 184, with a resistor 186 of value 2 R serves as a distortion cancellation circuit. A third HCM including the transistors 188, 189, and 190 biases the base of the NPN transistor 174. A fourth HCM that includes transistors 192, 193, and 194 with resistor 196, also of value 2R, completes the distortion cancellation circuitry.

Transistors 200, 201, 202, 203 with current sources 206 and 207, providing a bias currents of $I_{bias1}$ and $I_{bias2}$, define the floating grounds for all of the HCMs at the emitters of transistors 201 and 202.

The HCM that includes transistors 179, 180, and 180 and the HCM that includes the transistors 183, 183, and 184 can be viewed as the transconductor circuit 110, described above with respect to FIG. 5, with level shifting removed. A similar analogy exists with regard to the HCM that includes transistors 188, 189, and 190, and the HCM that includes the transistors 192, 193, and 194. The resistors 186 and 196 define the transconductances of the so-formed V-to-I converters.

Using the simple bipolar relationship $I_c + I_b = I_e$, operation of the circuit can be described as follows:

$$I_{175} = \frac{V_{IN} - e}{R} + I_{174} + I_{b174} - I_{b175} - I_{b0182} + I_{b0193},$$

where $I_{b174}$, $I_{b175}$, $I_{b0182}$, $I_{b0193}$ are the base currents of transistors 174, 175, 182, 193, respectively. In this equation, $V_{IN}/R$ is the only desired linear term, while $I_{b174} - I_{b175} - e/R$ induce nonlinearity and $I_{b0193} - I_{b0182}$ constitute a small offset error.

On the other hand, using the result written above for FIG. 5:

$$I1 = I0 + I_{b0182} + I_{b175} + \frac{e - V_{REF}}{2R}$$

and $$I3 = I0 + I_{b0193} + I_{b174} + \frac{V_{REF} - e}{2R}$$

therefore:

$$I3 - I1 = I_{b174} - I_{b175} - I_{b0182} - I_{b0193} + \frac{V_{REF} - e}{R}$$

which exactly contains the sum of the nonlinear and offset terms needed to be canceled from $I_p - I_n$.

By mirroring I1 and I3 with PNP and NPN mirrors (not shown), and feeding them back to nodes "a" and "b", or to node "e", the output current becomes:

$$I_{OUT} = I_{175} - I_{174} + I1 - I3 = \frac{V_{IN} - V_{REF}}{R},$$

delivering exactly linear class AB voltage-to-current conversion from the differential input ($V_{IN}-V_{REF}$).

In the circuit, current sources 210, 211, 212, and 213 do not need to be of large value, since $I_{b174}$ and $I_{b175}$ are added to then, and not subtracted, in the transistors 179 and 188. Also, the current sources do not need to be large, because the node "e" does not swing by a large amount of voltage around $V_{REF}$. Having the possibility to keep I0 small allows full advantage to be taken of the inherently low offset and high voltage swing of the class AB structure.

Figure 9:
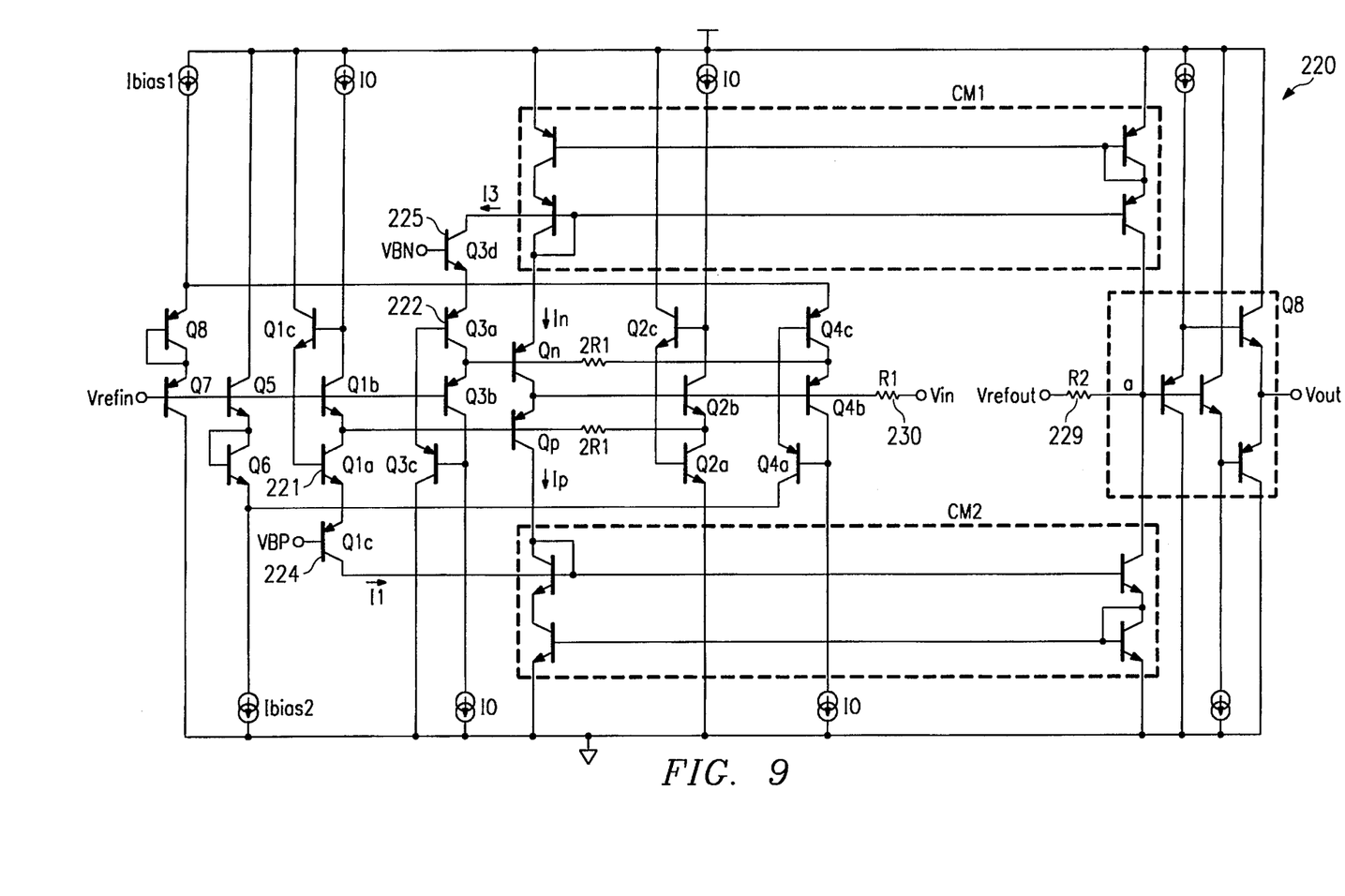
FIG. 9 is an electrical schematic diagram of a circuit, as one implementation of the circuit of FIG. 8, using the HCM circuits of the invention.

A more detailed implementation embodiment 220 of the transconductor 170 of FIG. 8 is shown in FIG. 9. The circuit 220 of FIG. 9 is one implementation of the circuit of FIG. 8, using the HCM circuits of the invention, in which currents can be diverted and added or subtracted at a single node. More particularly, in the circuit 220, the currents I1 and I3 are not mirrored, but are taken directly from the emitters of transistors 221 and 222, via transistors 224 and 225. Voltage sources VBP and VBN bias the bases of the transistors 224 and 225. Current mirrors CM1 and CM2 receive the sum (In +I3) and (Ip+I1), and duplicate them to the node of substraction "a", to which output buffer OB and the load resistor 229, of value 2R, are connected. This circuit can be used as a wideband open-loop amplifier of gain $-R_{229}/R_{230}$.

Although the invention has been described and illustrated with a certain degree of particularity, it is understood that the present disclosure has been made only by way off example, and that numerous changes in the combination and arrangement of parts can be resolted to by those skilled in the art without departing from the spirit and scope of the invention, as hereinafter claimed.

I claim:

1. A transconductor circuit comprising:
   a first half cascode mirror circuit, comprising:
      first, second, and third transistors;
      a first reference current source having a connection at one side to a supply voltage and at another side to said first transistor;
      said first and second transistors being connected in series between said first reference current source and a first reference voltage, said first transistor having a current control element connected to a second reference voltage;
      said third transistor being connected between the supply voltage and a current control element of said second transistor, and having a current control element connected between said first reference current source and said first transistor;
      a first input signal receiving node being provided between said first and second transistors;
      and a first output circuit arranged to provide an output signal proportional to a current flowing in said second transistor;
   a second half cascode mirror circuit, comprising:
      fourth, fifth, and sixth transistors;
      a second reference current source having a connection at one side to a supply voltage and at another side to said fourth transistor;
      said fourth and fifth transistors being connected in series between said second reference current source and the first reference voltage, said fourth transistor having a current control element connected to the second reference voltage;
      said sixth transistor being connected between the supply voltage and a current control element of said fifth transistor, and having a current control element connected between said second reference current source and said fourth transistor;
      a second input signal receiving node being provided between said fourth and fifth transistors;
      and a second output circuit arranged to provide an output signal proportional to a current flowing in said fifth transistor.

2. The transconductor circuit of claim 1 further comprising first and second input resistors, connected between respective voltage input terminals and the respective collectors of said second and fifth transistors.

3. The transconductor circuit of claim 2 wherein said input resistors are equal.

4. The transconductor circuit of claim 1 wherein said first and second output circuits are a current mirror circuits connected to copy currents respectively in said second and fifth transistor.

5. The transconductor circuit of claim 4 wherein said first and second output circuits comprise respective seventh and eighth transistors, each having a current control element connected to a current control element respectively of said second and fifth transistors.

6. The transconductor circuit of claim 1 wherein said first, second, third, fourth, fifth, and sixth transistors are bipolar transistors.

7. The transconductor circuit of claim 6 wherein said first, second, third, fourth, fifth and sixth transistors are NPN transistors.

8. A transconductor circuit comprising:
   first and second half cascode mirror circuits, each comprising:
      a cascode transistor, an active transistor, and a base current compensating transistor, each having an emitter, a base, and a collector; and
      a current source connected at one side to a supply voltage and at another side to said cascode transistor;
      said cascode and active transistors being connected in series between said current source and a first reference potential node;
      said base current compensating transistor being connected between the supply voltage and the base of said active transistor, and having its base connected between said current source and said cascode transistor;
   the bases of said cascode transistors of said first and second half cascode mirror circuits being connected to a second reference potential;
   and first and second output mirror circuits connected to mirror a current in a respectively one of said active transistors of said first and second half cascode mirror circuits;
   whereby, when a balanced input voltage is applied to respective voltage input nodes between said cascode and active transistors, corresponding balanced output currents are produced by said first and second output mirror circuits.

9. The transconductor circuit of claim 8 further comprising first and second input resistors, connected between the respective voltage input nodes and first and second respective input terminals.

10. The transconductor circuit of claim 9 wherein said input resistors are equal.

11. The transconductor circuit of claim 8 wherein said first and second output circuits are a current mirror circuits connected to copy currents respectively in said active transistors of said first and second half cascode mirror circuits.

12. The transconductor circuit of claim 11 wherein said first and second output circuits each comprise an output transistor having a base connected to the base of said active transistor of said half cascode mirror circuit with which said output circuit is associated.

13. The transconductor circuit of claim 12 wherein said aforenamed transistors are bipolar transistors.

14. The transconductor circuit of claim 13 wherein said transistors are NPN transistors.

15. The transconductor circuit of claim 8 further comprising a biasing current source connected between the first reference potential node and ground, and a biasing circuit connected to reference the second reference potential to a potential on the first reference potential node.

16. A transconductor circuit comprising:
   first and second hall cascode mirror circuits, each comprising:
      a cascode transistor, an active transistor, and a base current compensating transistor, each having an emitter, a base, and a collector; and
      a current source connected at one side to a supply voltage and at another side to said cascode transistor;
      said cascode and active transistors being connected in series between the current source and a first reference potential node;
      said base current compensating transistor being connected between the supply voltage and the base of said active transistor, and having its base connected between said current source and said cascode transistor;
   the bases of said cascode transistors of said first and second half cascode mirror circuits being connected to receive balanced voltage inputs;
   a resistor connected between a junction in each said first and second half cascode mirror circuits between said active and cascode transistors;
   and first and second output circuits connected to mirror a current in said first and second half cascode mirror circuits, each output circuit comprising, an output current transistor and a level shifting transistor connected in series between an output terminal and the first reference potential node, a base of said output current transistor being connected to the base of said cascode transistor;
   and first and second floating level shifting current sources connected between the respective first reference potential nodes of said first and second half cascode mirror circuits and a ground potential;
   whereby, when a balanced voltage inputs are applied, corresponding balanced output currents are produced by said first and second output circuits.

17. The transconductor circuit of claim 16 wherein all of said transistors are bipolar transistors.

18. The transconductor circuit of claim 17 wherein said transistors are NPN transistors.

19. A transconductor circuit comprising:
   first and second half cascode mirror circuits, each comprising:
      a cascode transistor, an active transistor, and a base current compensating transistor, each having an emitter, a base, and a collector; and
      a current source connected at one side to a supply voltage and at another side to said cascode transistor;
      said cascode and active transistors being connected in series between the current source and a first reference potential node;
   a base bias resistor;
   said base current compensating transistor being connected in series with said base bias resistor between the supply voltage and the base of said active transistor, and having its base connected between said current source and said cascode transistor;
   the bases of said cascode transistors of said first and second half cascode mirror circuits being connected to receive balanced voltage inputs;
   a resistor connected between a junction in each said first and second half cascode mirror circuits between said active and cascode transistors;
   and first and second output circuits connected to mirror a current in said first and second half cascode mirror circuits, each output circuit comprising an output current transistor connected in parallel with a respective active transistor of said first and second half cascode mirror circuits;
   and first and second floating level shifting current sources connected between the respective first reference potential nodes of said first and second half cascode mirror circuits and a ground potential.

20. The transconductor circuit of claim 19 wherein each of said first and second half cascode mirror circuits further comprises a feed forward capacitor connected between the base of said base current compensating transistor and the base of said active transistor.

21. The transconductor circuit of claim 20 wherein said feed forward capacitors and said base bias resistors of said first and second half cascode mirror circuits are of equal value.

22. The transconductor circuit of claim 19 wherein all of said transistors are bipolar transistors.

23. The transconductor circuit of claim 22 wherein said transistors are NPN transistors.

24. A transconductor circuit comprising:
   first and second half cascode mirror circuits, each comprising:
      a cascode transistor, an active transistor, and a base current compensating transistor, each having an emitter, a base, and a collector; and
      a current source connected at one side to a supply voltage and at another side to said cascode transistor;
      said cascode and active transistors being connected in series between said current source and a first reference potential node;
   a base bias resistor;
   said base current compensating transistor being connected in series with said base bias resistor between the supply voltage and the base of said active transistor, and having its base connected between said current source and said cascode transistor;
   the bases of said cascode transistors of said first and second half cascode mirror circuits being connected to receive balanced voltage inputs;
   a resistor connected between a junction in each said first and second half cascode mirror circuits between said active and cascode transistors;
   and first and second output circuits connected to mirror a current in said first and second half cascode mirror circuits, each output circuit comprising an output current transistor having an emitter, a base, and a collector, the base of said output current transistor being connected to the base of a respective active transistor of said first and second half cascode mirror circuits;
   and a floating level shifting current source connected between the supply voltage source and said output current transistors of said first and second half cascode mirror circuits.

25. The transconductor circuit of claim 24 wherein each of said first and second half cascode mirror circuits further comprises a feedforward capacitor connected between the base of said base current compensating transistor and the base of said active transistor.

26. The transconductor circuit of claim 25 wherein said feed forward capacitors and said base bias resistors are of equal value.

27. The transconductor circuit of claim 24 wherein said transistors of said first and second half cascode mirror circuits are NPN transistors, and said output current transistors are PNP transistors.

28. A transconductor circuit comprising:
a first cascode mirror circuit, comprising:
first, second, and third transistors;
a first reference current source having a connection at one side to a supply voltage and at another side to said first transistor;
said first and second transistors being connected in series between said first reference current source and a first reference voltage, said first transistor having a current control element connected to a second reference voltage;
said third transistor being connected between the supply voltage and a current control element of said second transistor, and having a current control element connected between said first reference current source and said first transistor;
and a first output circuit arranged to provide an output signal proportional to a current flowing in said second transistor;
a second cascode mirror circuit, comprising:
fourth, fifth, and sixth transistors;
a second reference current source having a connection at one side to a supply voltage and at another side to said fourth transistor;
said fourth and fifth transistors being connected in series between said second reference current source and said first reference voltage, said fourth transistor having a current control element connected to the second reference voltage;
said sixth transistor being connected between the supply voltage and a current control element of said fifth transistor, and having a current control element connected between said second reference current source and said fourth transistor;
and a second output circuit arranged to provide an output signal proportional to a current flowing in said fifth transistor;
a first nonlinearity correction circuit associated with said first cascode mirror circuit, comprising:
a seventh and eighth transistors and a third reference current source, connected in series between the supply voltage and a junction between said fourth and fifth transistors of said second cascode mirror circuit, a control element of said seventh transistor being connected to receive a first input voltage signal, and a control element of said eighth transistor being connected to said second reference voltage;
a second nonlinearity correction circuit associated with said first cascode mirror circuit, comprising:
a ninth and tenth transistors and a fourth reference current source, connected in series between the supply voltage and a junction between said first and second transistors of said first cascode mirror circuit, a control element of said ninth transistor being connected to receive a second input voltage signal, and a control element of said tenth transistor being connected to said second reference voltage;
a first resistor being connected between junctions of said first and second and said fourth and fifth transistors of said first and second cascode mirror circuits;
a second resistor being connected between junctions of said seventh transistor with said third reference current source and said ninth transistor with said fourth reference current source.

29. The transconductor circuit of claim 28 wherein said first, second, third, fourth, fifth, and sixth transistors are NPN bipolar transistors, and wherein said seventh, eighth, ninth, and tenth transistors are MOS FET transistors.

30. The transconductor circuit of claim 28 wherein said first and second resistors are equal.

31. The transconductor circuit of claim 28 wherein said first and second output circuits are a current mirror circuits connected to copy currents respectively in said second and fifth transistor.

32. The transconductor circuit of claim 31 wherein said first and second output circuits comprise respective eleventh and twelfth transistors, each having a current control element connected to a current control element respectively of said second and fifth transistors.

33. A Class AB transconductor circuit, comprising:
first, second, third and fourth half cascode mirror circuits, each comprising:
a cascode transistor, an active transistor, and a base current compensating transistor, each having an emitter, a base, and a collector; and
a current source connected at one side to a supply voltage and at another side to said cascode transistor;
said cascode and active transistors being connected in series between said current source and a first reference potential node;
said base current compensating transistor being connected between the supply voltage and the base of said active transistor, and having its base connected between said current source and said cascode transistor;
the bases of said cascode transistors of said first and third half cascode mirror circuits being connected to a second reference potential;
the bases of said cascode transistors of said second and fourth half cascode mirror circuits being connected to receive an input voltage;
a first resistor connected between junctions between said active and cascode transistors of said first and second half cascode mirror circuits;
a second resistor connected between junctions between said active and cascode transistors of said third and fourth half cascode mirror circuits;
and an output circuit comprising two output transistors connected in series between first and second current output terminals, each having a base element connected to be controlled by a potential on respective ones of said first and second resistors.

34. The Class AB transconductor circuit of claim 33 wherein said cascode, active, and base current compensating transistors of said first and second half cascode mirror circuits are NPN transistors, and said cascode, active, and base current compensating transistors of said third and fourth half cascode mirror circuits are PNP transistors.

35. The Class AB transconductor circuit of claim 34 wherein said two output transistors are an NPN transistor connected to be controlled by a potential on said second resistor and a PNP transistor connected to be controlled by a potential on said first resistor.

36. The Class AB transconductor circuit of claim 33 further comprising an input resistor connected to apply an input voltage on an input terminal to the bases of said cascode transistors of said second and fourth half cascode mirror circuits, and wherein said input resistor has a value of one half of the resistance of each of said first and second resistors.

* * * * *